US009568843B2

(12) United States Patent
Huang et al.

(10) Patent No.: US 9,568,843 B2
(45) Date of Patent: Feb. 14, 2017

(54) EXPOSURE METHOD AND EXPOSURE DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Changgang Huang, Beijing (CN); Hongjiang Wu, Beijing (CN); Song Wang, Beijing (CN); Jiyu Wan, Beijing (CN); Gyuhyun Lee, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 39 days.

(21) Appl. No.: 14/382,435

(22) PCT Filed: Jun. 14, 2013

(86) PCT No.: PCT/CN2013/077260
§ 371 (c)(1),
(2) Date: Feb. 24, 2015

(87) PCT Pub. No.: WO2014/146359
PCT Pub. Date: Sep. 25, 2014

(65) Prior Publication Data
US 2015/0160563 A1    Jun. 11, 2015

(30) Foreign Application Priority Data
Mar. 22, 2013 (CN) .......................... 2013 1 0094965

(51) Int. Cl.
G03F 7/20    (2006.01)

(52) U.S. Cl.
CPC ............ *G03F 7/707* (2013.01); *G03F 7/2014* (2013.01)

(58) Field of Classification Search
None
See application file for complete search history.

(56) References Cited

U.S. PATENT DOCUMENTS 5,378,583 A * 1/1995 Guckel ................. B81C 1/0038
430/252
5,679,502 A * 10/1997 Siddons ................ G03F 7/2039
205/118

(Continued)

FOREIGN PATENT DOCUMENTS

CN    101807007 A    8/2010
CN    102683252 A    9/2012

(Continued)

OTHER PUBLICATIONS

International Preliminary Report on Patentability issued Sep. 22, 2015; PCT/CN2013/077260.

(Continued)

*Primary Examiner* — Steven H Whitesell Gordon
(74) *Attorney, Agent, or Firm* — Ladas & Parry LLP

(57) ABSTRACT

Embodiments of the disclosure provide an exposure method and an exposure device. The exposure method comprises: placing at least two transparent substrates coated with photoresist under one mask, wherein all of the at least two substrates are in parallel with the mask; irradiating the mask vertically with parallel exposure light to respectively expose the photoresist on the at least two substrates along a propagation direction of the exposure light.

13 Claims, 4 Drawing Sheets

(56) References Cited

U.S. PATENT DOCUMENTS

| | | | |
|---|---|---|---|
| 6,032,997 A * | 3/2000 | Elliott | B25B 11/005 269/21 |
| 2006/0066833 A1 * | 3/2006 | Kuit | G03F 7/70733 355/72 |
| 2012/0230805 A1 | 9/2012 | Yamagishi et al. | |
| 2013/0183623 A1 * | 7/2013 | Shibazaki | G03F 7/70725 430/296 |

FOREIGN PATENT DOCUMENTS

| CN | 102819195 A | 12/2012 |
|---|---|---|
| GB | 2075701 A | 11/1981 |
| KR | 10-2007-0078647 A | 8/2007 |

OTHER PUBLICATIONS

Second Chinese Office Action issued by the Chinese Patent Office for Chinese Patent Application No. 201310094965.7 dated Jan. 12, 2015, 5pgs.
English translation of Second Chinese Office Action issued by the Chinese Patent Office for Chinese Patent Application No. 201310094965.7 dated Jan. 12, 2015, 4pgs.
First Chinese Office Action issued by the Chinese Patent Office for Chinese Patent Application No. 201310094965.7 dated Aug. 5, 2014, 6pgs.
English translation of First Chinese Office Action issued by the Chinese Patent Office for Chinese Patent Application No. 201310094965.7 dated Aug. 5, 2014, 7pgs.
International Search Report for International Application No. PCT/CN2013/077260, 11pgs.

* cited by examiner

EXPOSURE METHOD AND EXPOSURE DEVICE

CROSS REFERENCE TO RELATED APPLICATIONS

This application is based on International Application No. PCT/CN2013/077260 filed on Jun. 14, 2013, which claims priority to Chinese National Application No. 201310094965.7 filed on Mar. 22, 2013. The entire contents of each and every foregoing application are incorporated herein by reference.

TECHNICAL FIELD

Embodiments of the disclosure relate to a display technology, more particularly, to an exposure method and an exposure device for implementing the exposure method.

BACKGROUND

With the advantages of stable and vivid image, low radiation, saving space and saving energy, liquid crystal display (LCD) has dominated the flat panel display field. Thin Film Transistor-Liquid Crystal Display (TFT-LCD) is an important liquid crystal display, and a Thin Film Transistor (TFT) array substrate and a color filter substrate are main components of the TFT-LCD. The manufacture efficiency of the array substrate and the color filter substrate determines the production efficiency of the whole display device.

During manufacturing the array substrate and the color filter substrate, photolithography technique is very important. As shown in FIG. 2, the photolithography technique generally comprises: coating a photoresist (steps S1'-S2' shown in FIG. 2), prebaking and exposing (step S3' shown in FIG. 2), developing (step S4' shown in FIG. 2) and post-baking. In the step of coating the photoresist, the photoresist is coated on the substrate after forming a film on the substrate. In the step of prebaking, the photoresist is preheated and moisture in the photoresist is removed so as to enhance the adhesion between the photoresist and the substrate. In the step of exposing, exposure light is irradiated on the photoresist through a mask and the photoresist is exposed. In the step of developing, the exposed portion of the photoresist is removed through a developer, thereby forming a desired pattern. In the step of post-baking, the un-exposed portion of the photoresist is cured and the adhesion between the un-exposed portion of the photoresist and the substrate is enhanced.

Presently, the exposure device mainly comprises a light source for providing parallel exposure light, a mask and an exposure platform. As shown in FIG. 1, a substrate 2 coated with a photoresist 3 is placed on an exposure platform 4; parallel exposure light 5 provided by the light source vertically irradiates on the substrate 2 through a mask 1, so as to form a pattern in accordance with the mask. Thus, one mask is only able to expose one substrate every time, and merely the exposure of one substrate is completed within the cycle of one production. Meanwhile, only a few part of the exposure light provided by the light source is utilized, and most of other light is lost and is not utilized sufficiently. Therefore, the exposure method and the exposure device are low in exposure efficiency and cause the waste of energy resource.

SUMMARY

Embodiments of the disclosure provide an exposure method, and the method comprising: placing at least two transparent substrates coated with photoresist under one mask, wherein all of the at least two substrates are in parallel with the mask; irradiating the mask vertically with parallel exposure light to respectively expose the photoresist on the at least two substrates along a propagation direction of the exposure light.

For example, the method further comprises: correcting the propagation direction of the exposure light after the exposure light passes through a previous substrate and before the exposure light exposes the photoresist on a next substrate, so as to form parallel light to vertically irradiate the next substrate.

For example, the substrates are placed in predetermined positions.

Embodiments of the disclosure further provide an exposure device for implementing the exposure method, and the exposure device comprises: a light source for providing parallel exposure light, a mask and at least two substrate bearing mechanisms. The mask and the at least two substrate bearing mechanisms are arranged sequentially along a propagation direction of the exposure light. The mask and the at least two substrate bearing mechanisms are perpendicular to the propagation direction of the exposure light.

For example, a light adjusting mechanism for correcting the propagation direction of the exposure light is arranged between two adjacent substrate bearing mechanisms.

For example, the light source comprises a surface light source emitting parallel ultraviolet rays.

For example, the light adjusting mechanism comprises a concave lens.

For example, the substrate bearing mechanism provided in a propagation path of the exposure light comprises a transparent exposure platform which is made of quartz glass.

For example, the exposure device further comprises a substrate transferring mechanism for transferring the substrate to the substrate bearing mechanism.

For example, the substrate transferring mechanism comprises a substrate clamping unit, and the substrate clamping unit comprises a first clamp for clamping both upper and lower surfaces of the substrate and a second clamp for clamping side surfaces of the substrate.

For example, the exposure light irradiates downwards vertically; several through holes are provided in a lowest substrate bearing mechanism, and substrate supporting pillars capable of passing through the through holes are provided at a bottom of this substrate bearing mechanism; the substrate transferring mechanism further comprises a mechanical arm; after the mechanical arm carries the substrate to the substrate supporting pillars which pass through and move out of the through holes, the substrate supporting pillars retract into the through holes; and the substrate clamping unit is used for transferring the substrate to other substrate bearing mechanisms.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure. With reference now to the drawings and embodiments, the detailed implementation modes of the disclosure will be further described. The following embodiments are only illustrative rather than limitative of the disclosure.

The exposure device according to the embodiments of the disclosure, which is applicable to a substrate with a film capable of transmitting light, mainly comprises a light source for providing parallel exposure light, a mask and at least two substrate bearing mechanisms. The mask and the at least two substrate bearing mechanisms are arranged sequentially along a propagation direction of the exposure light. The mask and the at least two substrate bearing mechanisms are perpendicular to the propagation direction of the exposure light. For the substrate is mostly arranged in a horizontal plane in practical operation, the mask and the substrate bearing mechanisms in the embodiments are arranged in the horizontal plane, and the exposure light vertically irradiates the mask downwards. Meanwhile, since the exposure light loses part of energy after exposing a photoresist on every substrate, the exposure effect is not satisfactory if the exposure is simultaneously performed on a lot of substrates. Therefore, the embodiments of the disclosure illustrate the example of simultaneously exposing the photoresist on two substrates.

Figure 1:
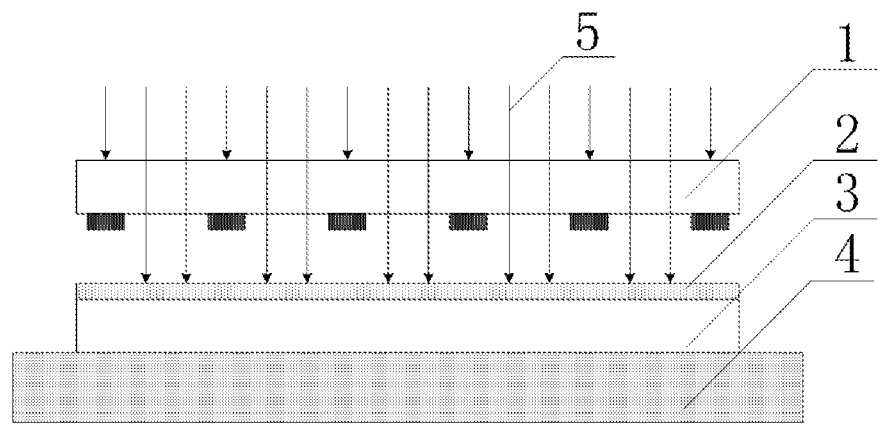
FIG. 1 is structural schematic view illustrating an exposure device according to one technique.
Figure 2:
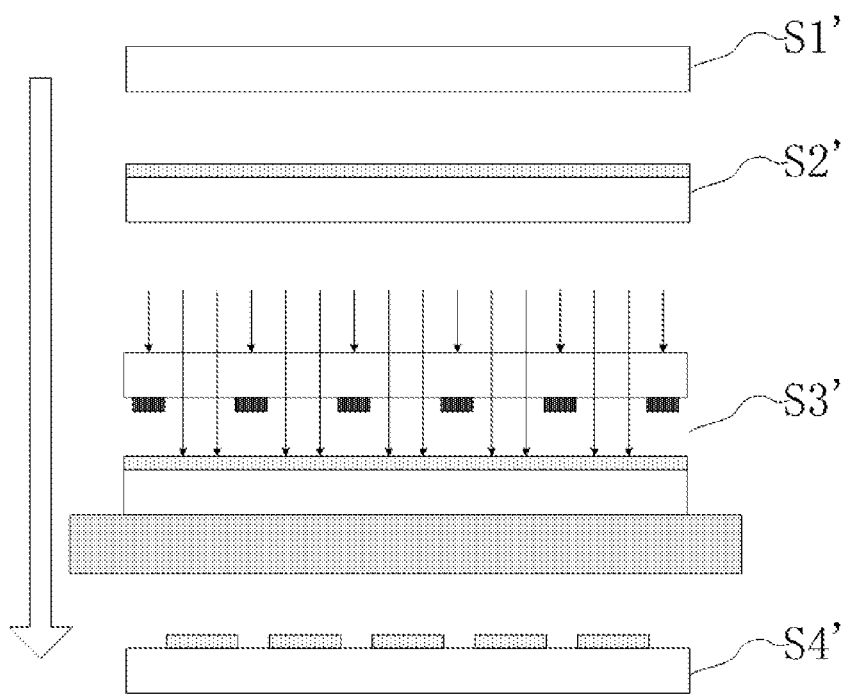
FIG. 2 is a flow view illustrating an exposure method according to one technique.
Figure 3:
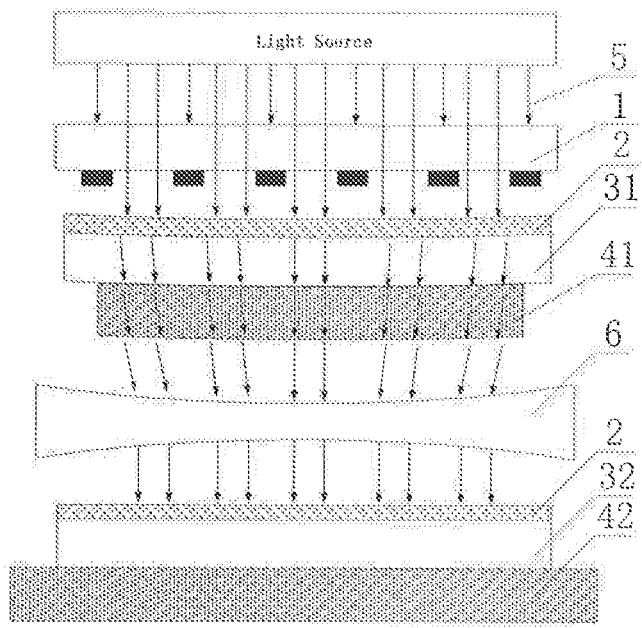
FIG. 3 is a structural schematic view illustrating an exposure device according to the embodiments of the disclosure.
Figure 4:
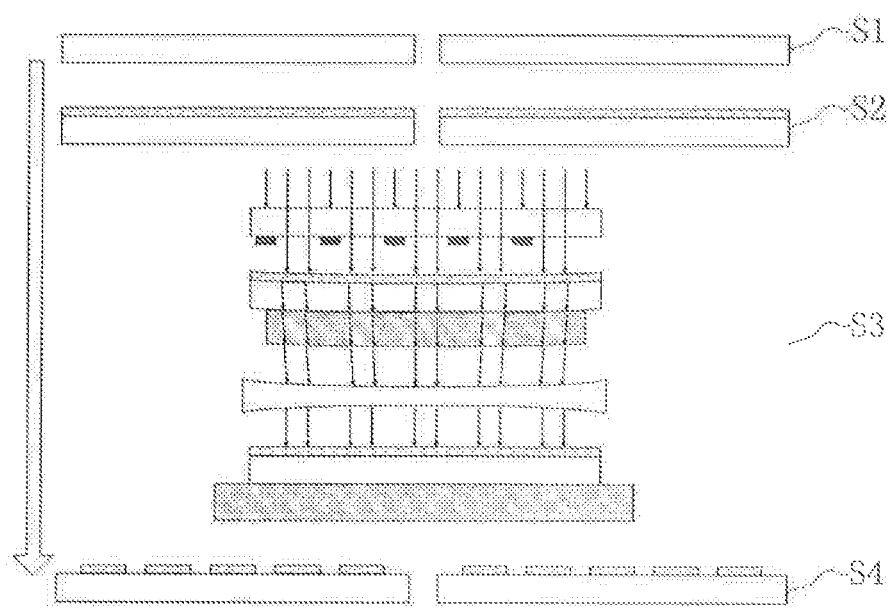
FIG. 4 is a flow view illustrating an exposure method according to the embodiments of the disclosure.

The exposure device show in FIG. 3 mainly comprises a light source, a mask 1 and two substrate bearing mechanisms. For example, the two substrate bearing mechanisms are respectively provided in a horizontal plane and comprise a first exposure platform 41 and a second exposure platform 42 which is in parallel with the first exposure platform 41 and provided under the first exposure platform 41. The first exposure platform 41 and the second exposure platform 42 are placed in predetermined positions, and their horizontal and vertical positions are adjusted according to aligning marks. The first exposure platform 41 is used for bearing a first substrate 31, and the second exposure platform 42 is used for bearing a second substrate 32. The first substrate 31 and the second substrate 32 are both transparent. Both of the first substrate 31 and the second substrate 32 are coated with a photoresist 2. The mask 1 is placed above the first exposure platform 41 and is in parallel with the first exposure platform 41. For example, the light source comprises a surface light source emitting parallel ultraviolet rays, for the wavelength range of the ultraviolet rays is within the spectral band capable of being absorbed by the photoresist so that the utilization efficiency of the light energy is improved. An exposure method using the exposure device is shown in FIG. 4. Firstly, the first substrate 31 and the second substrate 32 which are coated with the photoresist are respectively placed on the first exposure platform 41 and the second exposure platform 42; parallel exposure light 5 provided by the light source vertically irradiates the mask 1 to expose the photoresist on the first substrate 31 through a transmitting portion of the mask 1, so that a pattern corresponding to the mask 1 is formed on the first substrate 31. The exposure light which is not absorbed by the first substrate 31 irradiates the second substrate 32 through the first substrate 31 and the first exposure platform 41 so as to expose the photoresist on the second substrate 32, and a pattern is formed on the second substrate 32. For the exposure light is parallel light, the pattern formed on the first substrate 31 is same as the pattern formed on the second substrate 32. In the exposure method according to the embodiments of the disclosure, the exposure efficiency is effectively improved for the exposure is simultaneously performed on the photoresist on at least two substrates. Moreover, as the number of the masks is reduced, the exposure cost is greatly lowered. Besides, since the exposure light is sufficiently used, the energy consumption is reduced and the exposure cost is further lowered.

In order to reduce an energy loss of the exposure light, the first exposure platform 41 for example is made of materials with high transmittance. For example, the first exposure platform 41 in the embodiments is made of a transparent quartz glass with polished upper and lower sides, and its size and strength are determined according to the shape and weight of the substrate to be loaded. For the second exposure platform 42 is free from the requirements on the light transmittance, it is made of the same material as the first exposure platform 41, or of other materials different from the first exposure platform 41. A supporting platform for supporting the second exposure platform 42 is disposed under the second exposure platform 42. Moreover, several through holes are provided in the second exposure platform 42, and substrate supporting pillars which are capable of passing through the through holes and are used to support the second substrate 32 are provided at the bottom of the second exposure platform 42. In order to avoid shielding the exposure light, no supporting components are provided between the first exposure platform 41 and the second exposure platform 42, namely, the supporting platform and the substrate supporting pillars are not provided under the first exposure platform 41.

In order to ensure that the exposure light irradiating the second substrate 32 through the first exposure platform 41 is consistent with the exposure light irradiating the first substrate 31 through the mask in terms of patterns, the exposure light irradiating the second substrate 32 must be parallel light. However, since the supporting platform is not arranged between the first exposure platform 41 and the second exposure platform 42, the weight of both the first substrate 31 and the first exposure platform 41 may cause the first exposure platform 41 to bend downwards slightly, thereby the propagation direction of the exposure light after the exposure light passes through the first substrate 31 and the first exposure platform 41 will deflect and the exposure light is not parallel anymore, as shown in FIG. 3. In order to solve this problem, a light adjusting mechanism is arranged between the first exposure platform 41 and the second exposure platform 42 according to the embodiments of the disclosure. Before the exposure light irradiates the photoresist on the second substrate 32 and after the exposure light passes through the first substrate 31 and the first exposure platform 41, the propagation direction of the exposure light is corrected by the light adjusting mechanism so as to form parallel light which vertically irradiates the second substrate 32. According to the embodiments, the light adjusting mechanism mainly comprises a concave lens 6, and a curvature of a concave face of the concave lens 6 and a position of the concave lens 6 are determined according to a deflection degree of the propagation direction of the exposure light after passing through the first exposure platform 41. The non-parallel light after passing through the first exposure platform 41 becomes parallel light by using the concave lens 6, and the resulted parallel light irradiates the second substrate 32 so that the pattern of the mask is transferred to the second substrate 32.

Figure 5:
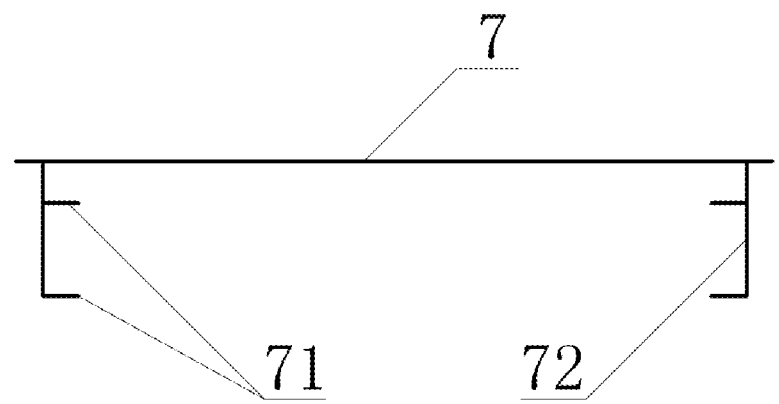
FIG. 5 is a structural schematic view illustrating a substrate clamping unit according to the embodiments of the disclosure.

Since the substrate supporting pillar is not provided under the first exposure platform 41, the first substrate 31 cannot be carried to the first exposure platform 41 by a normal carrying method using a mechanical arm. Therefore, the embodiments of the disclosure further designs a substrate transferring mechanism for transferring the substrate to the substrate bearing mechanism. The substrate transferring mechanism mainly comprises a substrate clamping unit 7 shown in FIG. 5; and the substrate clamping unit comprises a first clamp 71 for clamping both upper and lower surfaces of the substrate and a second clamp 72 for clamping side surfaces of the substrate. For the substrate supporting pillar is provided under the second exposure platform 42, the second substrate 32 may be transferred by the normal carrying method using the mechanical arm, or by the substrate clamping unit 7. For example, the substrate transferring mechanism according to the embodiments comprises the substrate clamping unit 7 for moving the first substrate 31 to the first exposure platform 41 and a mechanical arm for moving the second substrate 32 to the second exposure platform 42. Below, the substrate transferring mechanism according to the embodiments of the disclosure will be described with reference to FIG. 6 and FIG. 7.

Figure 6:
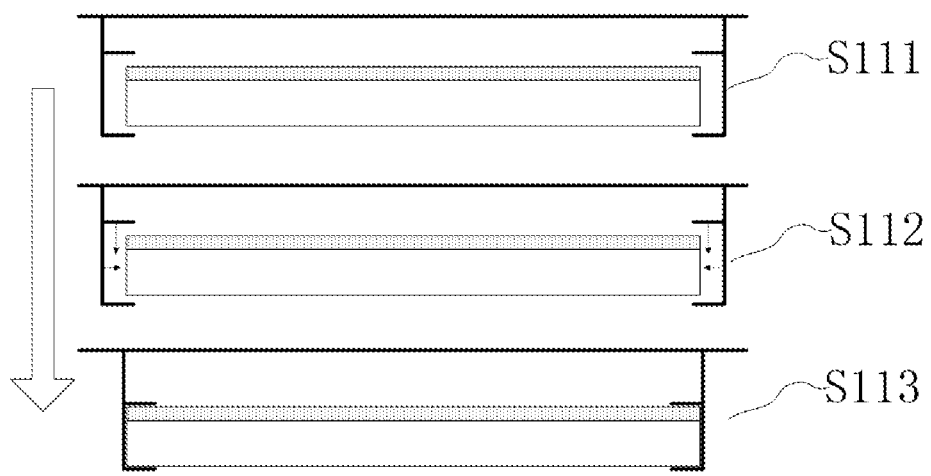
FIG. 6 is a flow view illustrating an operation of the substrate clamping unit according to the embodiments of the disclosure.
Figure 7:
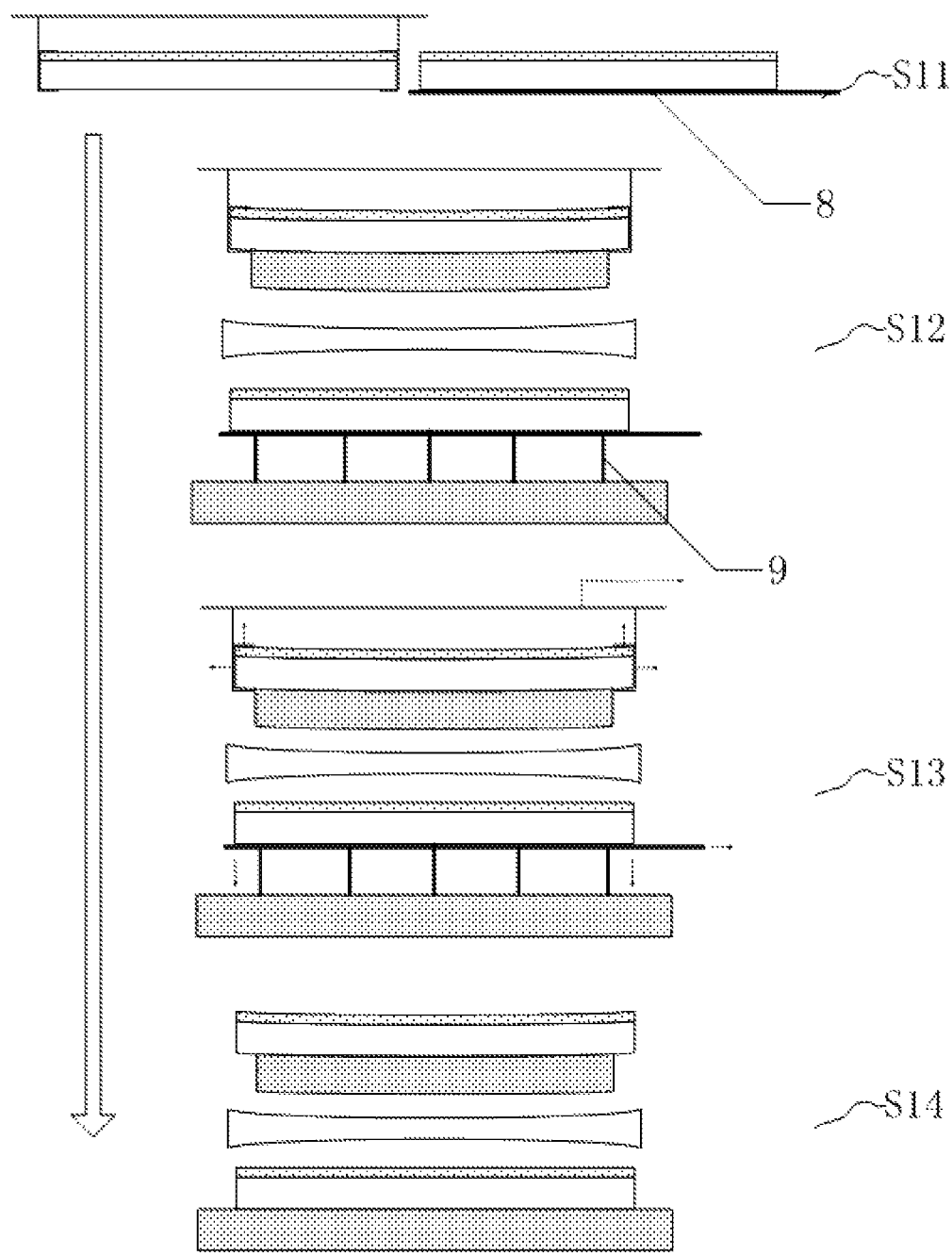
FIG. 7 is a flow view illustrating a substrate transferring process according to the embodiments of the disclosure.

As shown in FIG. 6 and FIG. 7, the first clamp 71 is capable of moving in a vertical direction and is used for fixing and clamping both the upper and lower surfaces of the substrate. The second clamp 72 is capable of moving in a horizontal direction and is used for fixing and clamping the side surfaces of the substrate. When the first substrate 31 is transferred to the first exposure platform 41, the substrate clamping unit 7 firstly descends so that the bottom of the second clamp 72 is substantially flush with the bottom surface of the first substrate 31; the second clamp 72 moves towards the first substrate 31 so that four side surfaces of the first substrate 31 are clamped tightly. Then the first clamp 71 moves towards the first substrate 31 so that the upper and lower surfaces of the substrate are clamped and fixed. After the first substrate 31 is clamped and fixed, the substrate clamping unit 7 carries the first substrate 31 to the first exposure platform 41, and places the first substrate 31 onto the first exposure platform 41 according to the alignment mark. Then the first clamp 71 and the second clamp 72 move away from the first substrate 31 so as to loose the first substrate 31, and then, the whole substrate clamping unit moves out of the first exposure platform 41. After the exposure of the photoresist on the first substrate 31 is finished, the substrate clamping unit 7 moves the first substrate 31 away from the first exposure platform 41, and at this time, the first and second clamps move in directions opposite to those during moving the first substrate 31 onto the first exposure platform 41. When the second substrate 32 is transferred to the second exposure platform 42, the substrate supporting pillars 9 pass through and move out of the through holes, the mechanical arm 8 moves the second substrate 32 to the substrate supporting pillars 9. Then the mechanical arm 8 is taken back, the substrate supporting pillars 9 retract into the through holes, and the second substrate 32 is placed onto the second exposure platform 42 according to the alignment mark. After the photoresist on the second substrate 32 is exposed, the substrate supporting pillars 9 pass through and move out of the through holes to jack up the second substrate 32. The mechanical arm 8 moves the second substrate 32 away from the substrate supporting pillars 9, and the substrate supporting pillars 9 retract into the through holes. The first substrate 31 and the second substrate 32 are placed in predetermined positions, and are arranged in parallel on different layers. The horizontal positions of the first substrate 31 and the second substrate 32 are adjusted according to the alignment marks; and the vertical positions thereof are set by the positions of the first and second exposure platforms. In the practical production process, the first substrate 31 and the second substrate 32 are simultaneously transferred in or out of After the first substrate 31 and the second substrate 32 are simultaneously moved to the exposure platforms, the exposure is carried out. After the exposure is performed, the two substrates are simultaneously moved away from the exposure platforms.

In the exposure method according to the embodiments of the disclosure, a plurality of substrates coated with photoresist are placed under one mask; the parallel exposure light vertically irradiates the mask; the parallel exposure light firstly exposes the photoresist on an uppermost substrate; and the parallel exposure light passing through the uppermost substrate continues to expose the photoresist on a lower substrate and so on, until the exposure process of the photoresist on all substrates are completed. For the photoresist on the plurality of substrates are exposed at the same time, the exposure efficiency is effectively improved. Moreover, as the number of the masks is reduced, the exposure cost is greatly lowered. Besides, since the exposure light is sufficiently used, the energy consumption is reduced and the exposure cost is further lowered.

The above implementation modes are only illustrative rather than limitative of the disclosure. A person of ordinary skill in the art can also make modifications and variations without departing from the sprit and scope of this disclosure. Therefore, all equivalent technical solutions also fall into the scope of the disclosure, and the scope of the disclosure is determined by the appended claims.

What is claimed is:

1. An exposure method, comprising:
    placing at least two transparent substrates coated with photoresist under one mask, wherein all of the at least two substrates are in parallel with the mask;
    irradiating the mask vertically with parallel exposure light to respectively expose the photoresist on the at least two substrates along a propagation direction of the exposure light;
    wherein the exposure method further comprises: correcting the propagation direction of the exposure light after the exposure light passes through a previous substrate and before the exposure light exposes the photoresist on a next substrate, so as to form parallel light to vertically irradiate the next substrate.

2. The exposure method according to claim 1, wherein the substrates are placed in predetermined positions.

3. An exposure device, comprising:
    a light source for providing parallel exposure light, a mask and at least two substrate bearing mechanisms, wherein the mask and the at least two substrate bearing mechanisms are arranged sequentially along a propagation direction of the exposure light; and the mask and the at least two substrate bearing mechanisms are perpendicular to the propagation direction of the exposure light, wherein a light adjusting mechanism for correcting the propagation direction of the exposure light is arranged between two adjacent substrate bearing mechanisms.

4. The exposure device according to claim 3, wherein the light source comprises a surface light source emitting parallel ultraviolet rays.

5. The exposure device according to claim 3, wherein the light adjusting mechanism comprises a concave lens.

6. The exposure device according to claim 3, wherein the substrate bearing mechanism provided in a propagation path of the exposure light comprises a transparent exposure platform which is made of quartz glass.

7. The exposure device according to claim 6, further comprising a substrate transferring mechanism for transferring a substrate to the substrate bearing mechanism.

8. The exposure device according to claim 7, wherein the substrate transferring mechanism comprises a substrate clamping unit, and the substrate clamping unit comprises a first clamp for clamping both upper and lower surfaces of the substrate and a second clamp for clamping side surfaces of the substrate.

9. The exposure device according to claim 8, wherein the exposure light irradiates downwards vertically;

several through holes are provided in a lowest substrate bearing mechanism, and substrate supporting pillars capable of passing through the through holes are provided at a bottom of this substrate bearing mechanism;

the substrate transferring mechanism further comprises a mechanical arm;

after the mechanical arm carries the substrate to the substrate supporting pillars which pass through and move out of the through holes, the substrate supporting pillars retract into the through holes; and the substrate clamping unit is used for transferring the substrate to other substrate bearing mechanisms.

10. The exposure device according to claim 3, further comprising a substrate transferring mechanism for transferring a substrate to the substrate bearing mechanism.

11. The exposure device according to claim 10, wherein the substrate transferring mechanism comprises a mechanical arm for moving the substrate to a lowest substrate bearing mechanism and a substrate clamping unit for moving the substrate to other substrate bearing mechanisms.

12. The exposure device according to claim 11, wherein the substrate clamping unit comprises a first clamp for clamping both upper and lower surfaces of the substrate and a second clamp for clamping side surfaces of the substrate.

13. The exposure device according to claim 11, wherein several through holes are provided in the lowest substrate bearing mechanism, and substrate supporting pillars capable of passing through the through holes are provided at a bottom of this substrate bearing mechanism.

* * * * *